United States Patent
Chang

(10) Patent No.: US 7,124,807 B2
(45) Date of Patent: Oct. 24, 2006

(54) HEAT DISSIPATION DEVICE HAVING THERMALLY CONDUCTIVE COVER BOARD

(75) Inventor: Juei-Chi Chang, Taipei (TW)

(73) Assignee: Mitac Technology Corp., Hsin-Chu Hsien (TW)

( * ) Notice: Subject to any disclaimer, the term of this patent is extended or adjusted under 35 U.S.C. 154(b) by 2 days.

(21) Appl. No.: 11/062,865

(22) Filed: Feb. 23, 2005

(65) Prior Publication Data
US 2005/0252641 A1    Nov. 17, 2005

(30) Foreign Application Priority Data
May 13, 2004    (TW) ............................... 93113431 A

(51) Int. Cl.
*F28D 15/02*    (2006.01)
(52) U.S. Cl. .................... 165/80.3; 165/104.33
(58) Field of Classification Search ............... 165/80.3, 165/104.21, 104.26, 104.33
See application file for complete search history.

(56) References Cited

U.S. PATENT DOCUMENTS

| | | | |
|---|---|---|---|
| 5,145,001 A * | 9/1992 | Valenzuela | 165/164 |
| 5,838,066 A | 11/1998 | Kitajo | |
| 5,940,267 A * | 8/1999 | Katsui et al. | 361/697 |
| 6,122,169 A * | 9/2000 | Liu et al. | 361/700 |
| 6,151,214 A * | 11/2000 | Yeh | 361/695 |
| 6,196,307 B1 * | 3/2001 | Ozmat | 165/185 |
| 6,328,097 B1 * | 12/2001 | Bookhardt et al. | 165/104.33 |
| 6,538,884 B1 * | 3/2003 | Wong et al. | 361/688 |
| 6,752,201 B1 * | 6/2004 | Cipolla et al. | 165/121 |
| 2002/0053421 A1 * | 5/2002 | Hisano et al. | 165/104.33 |
| 2003/0000684 A1 * | 1/2003 | Huang et al. | 165/104.33 |
| 2003/0128514 A1 * | 7/2003 | Inoue | 361/695 |

FOREIGN PATENT DOCUMENTS

TW    372084    10/1999

* cited by examiner

*Primary Examiner*—Teresa J. Walberg
(74) *Attorney, Agent, or Firm*—Rosenberg, Klein & Lee

(57) ABSTRACT

A heat dissipation device includes a casing forming a receptacle for receiving and retaining a fan module and a finned structure that includes spaced fins to define channels through air flows for primary exchange of heat with the heat dissipation device. The heat dissipation device further includes a thermally conductive surface cover board that is mounted to the casing to at least partly cover an air entrance that is defined in the casing to allow air to be drawn into the casing by the fan module. The surface cover board defines air passages through which air is conducted into the casing. Heat is exchanged with the air when the airflow passes through the surface cover board. Thus, the heat dissipation device features twice heat exchange with airflow and thus enhanced heat removal rate by simply adding the surface cover board to the casing and without significant modification of the existing heat dissipation device.

7 Claims, 9 Drawing Sheets

HEAT DISSIPATION DEVICE HAVING THERMALLY CONDUCTIVE COVER BOARD

FIELD OF THE INVENTION

The present invention relates generally to a heat dissipation device, and in particular to a heat dissipation device having a thermally conductive surface cover board to enhance heat removal rate.

BACKGROUND OF THE INVENTION

Integrated circuits (ICs) are commonly employed in various electrical/electronic devices. The ICs are often subject to constraint of temperature in order to maintain proper operation. In other words, heat generated by the ICs must be timely removed in order to maintain proper operation temperature of the ICs. A heat dissipation device is often employed to remove heat generated by the ICs. This is of vital importance for some ICs, such as a central processing unit (CPU) of a computer system, for the CPU is the core of operation of the computer system. Malfunctioning or improper operation of the CPU due to undesired high temperature usually results in system failure of the computer. A conventional heat dissipation device for the computer CPU comprises a thermally conductive board mounted on the CPU and a plurality of space fins extending from the board. Airflow induced by a cooling fan passes through channels defined between adjacent fins effectively remove heat from the fins by convection, as well as radiation.

With the increase of operation speed (or system clock) of the computer, heat generated by the CPU is remarkably increased. However, for such high-speed computers, heat removed from the CPU by the finned heat dissipation device is not sufficient to maintain the operation temperature of the CPU. This is especially true for computers having small physical size, such as a notebook computer, which has an impact arrangement of electronic parts, making it extremely difficult to install a large-sized heat dissipation device having large capacity of heat removal.

In addition to the finned structure and the fan that causes airflow through the finned structure, a heat pipe is commonly employed in the notebook computer to enhance heat removal. Opposite ends of the heat pipe are in physical engagement with the thermally conductive board that is positioned on and in contact with the CPU and the finned structure through which the airflow passes for facilitating transfer of heat from the CPU to the finned structure from which the heat is carried away by the airflow.

The heat pipe facilitates transferring heat from the board positioned on the CPU to the finned structure to allow heat to be removed by airflow. However, due to the significant different in size between the heat pipe and the board, heat that is transferred from the board by the heat pipe is constrained to a local area around the contact point between the heat pipe and the board. Most of heat is still accumulated in the board at locations other than the contact point between the heat pipe and the board. This limits the effectiveness of transferring heat from the board by the heat pipe.

Modifying the overall configuration and arrangement of the heat dissipation device or the contact point between the heat pipe and the board, may be helpful in overcoming the problem. However, due to the physical limitation of the compact space inside the notebook computer, and also due to the existing arrangement of the electronic/mechanical components inside the notebook computer, such a modification is, in fact, very difficult and impractical, if not impossible.

Thus, the present invention is aimed to overcome the limitation of heat transfer in the conventional designs in order to enhance heat transfer in a heat dissipation device without significant modification of the existing arrangement inside an electronic device that employs the heat dissipation device to maintain proper operation temperature.

SUMMARY OF THE INVENTION

A primary objective of the present invention is to provide a heat dissipation device having enhanced heat transfer and thus heat removal rate without significant modification of an existing heat dissipation device.

Another objective of the present invention is to provide a heat dissipation device comprising a thermally conductive surface cover board to enhance heat removal rate of the heat dissipation device.

A further objective of the present invention is to provide a force-convection heat dissipation device that, besides primary heat transfer between a finned structure of the heat dissipation device and airflow induced by a fan, also performs secondary heat transfer between the heat dissipation device and airflow so as to enhance heat removal rate of the heat dissipation device.

To achieve the above objectives, in accordance with the present invention, there is provided a heat dissipation device, comprising a casing forming a receptacle for receiving and retaining a fan module and a finned structure that includes spaced fins to define channels through air flows for primary exchange of heat with the heat dissipation device. The heat dissipation device further comprises a thermally conductive surface cover board that is mounted to the casing to at least partly cover an air entrance that is defined in the casing to allow air to be drawn into the casing by the fan module. The surface cover board defines air passages through which air is conducted into the casing. Heat is exchanged with the air when the airflow through the surface cover board. Thus, the heat dissipation device features twice heat exchange with airflow and thus enhanced heat removal rate by simply adding the surface cover board to the casing and without significant modification of the existing heat dissipation device.

BRIEF DESCRIPTION OF THE DRAWINGS

The present invention will be apparent to those skilled in the art by reading the following description of preferred embodiments thereof, with reference to the attached drawings, in which.

DETAILED DESCRIPTION OF PREFERRED EMBODIMENTS

Figure 1:
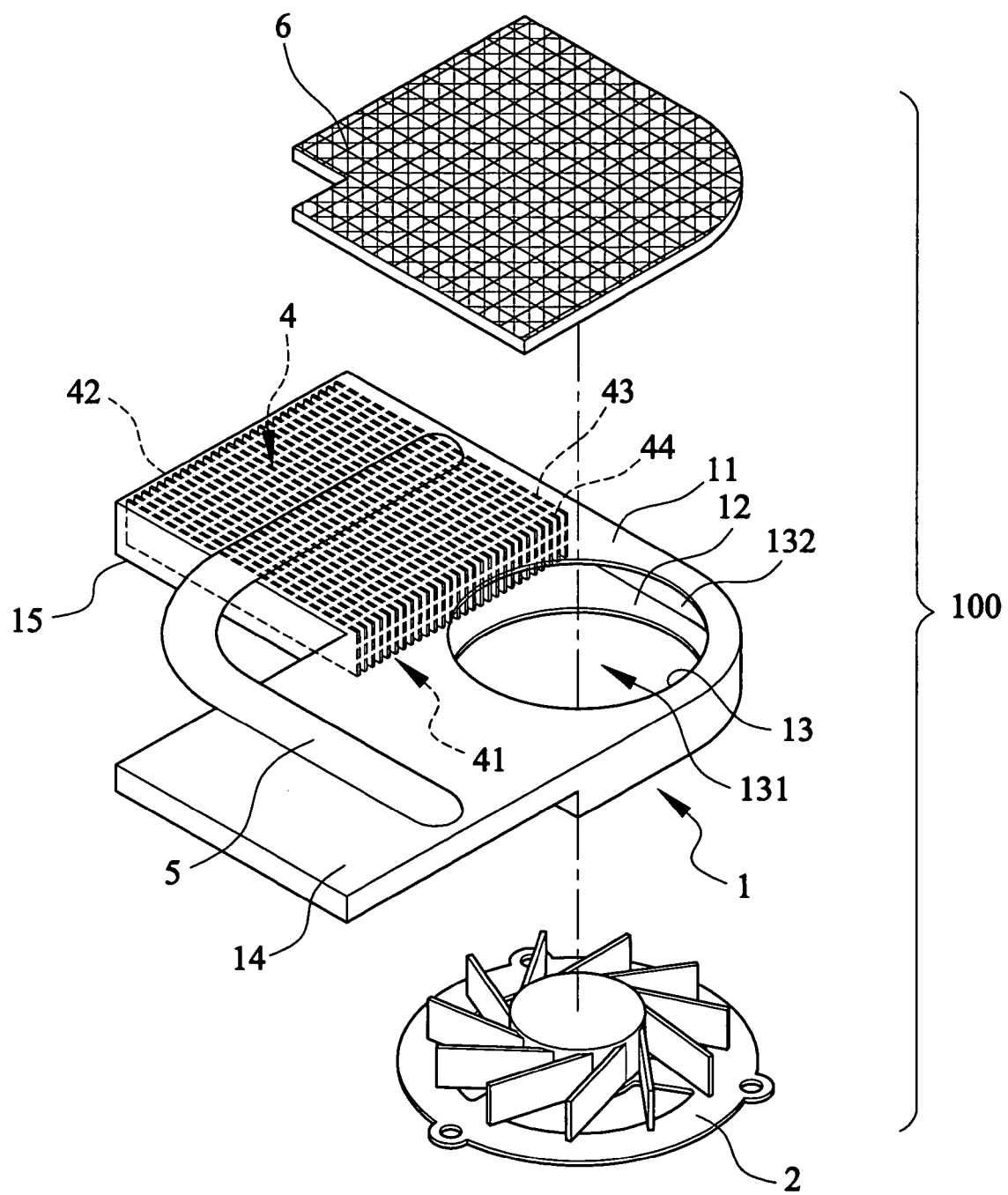
FIG. 1 is an exploded view of a heat dissipation device constructed in accordance with the present invention.
Figure 2:
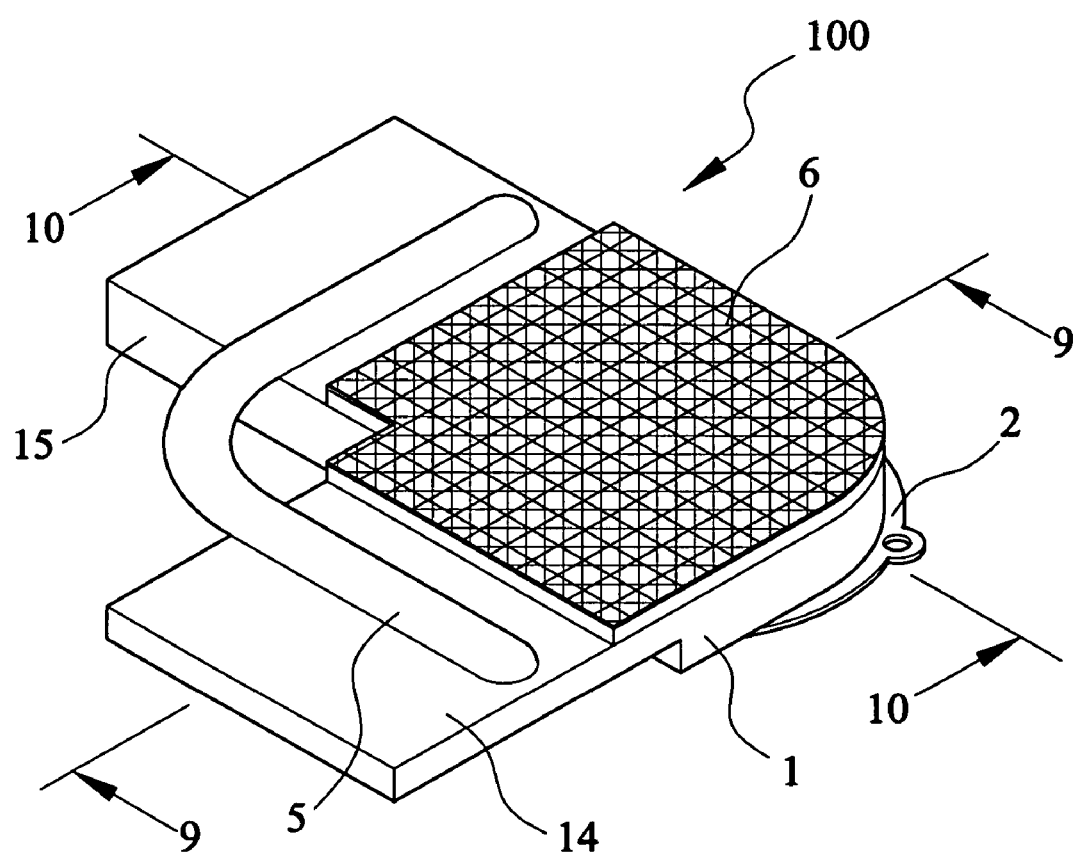
FIG. 2 is an assembled perspective view of the heat dissipation device of the present invention.

With reference to the drawings and in particular to FIGS. 1 and 2, a heat dissipation device constructed in accordance with the present invention, generally designated with reference numeral 100, comprises a casing 1, made of thermally conductive material, which is comprised of spaced and opposite upper and lower plates 11, 12 connected to each other by a sidewall (not labeled) to define a chamber inside the casing 1. Aligned holes are defined in the upper and lower plates 11, 12 to form a receptacle 13 for receiving and retaining a fan module 2. The hole defined in the upper plate 11 that constitutes in part the fan receptacle 13 serves an a first entrance or inlet 131 for air drawn into the chamber by the fan module 2. An opening 132 is defined in the sidewall functions as a second entrance or inlet for air drawn into the chamber by the fan module 2. Alternatively, the chamber may have an open sidewall to provide the second air entrance.

Figure 3:
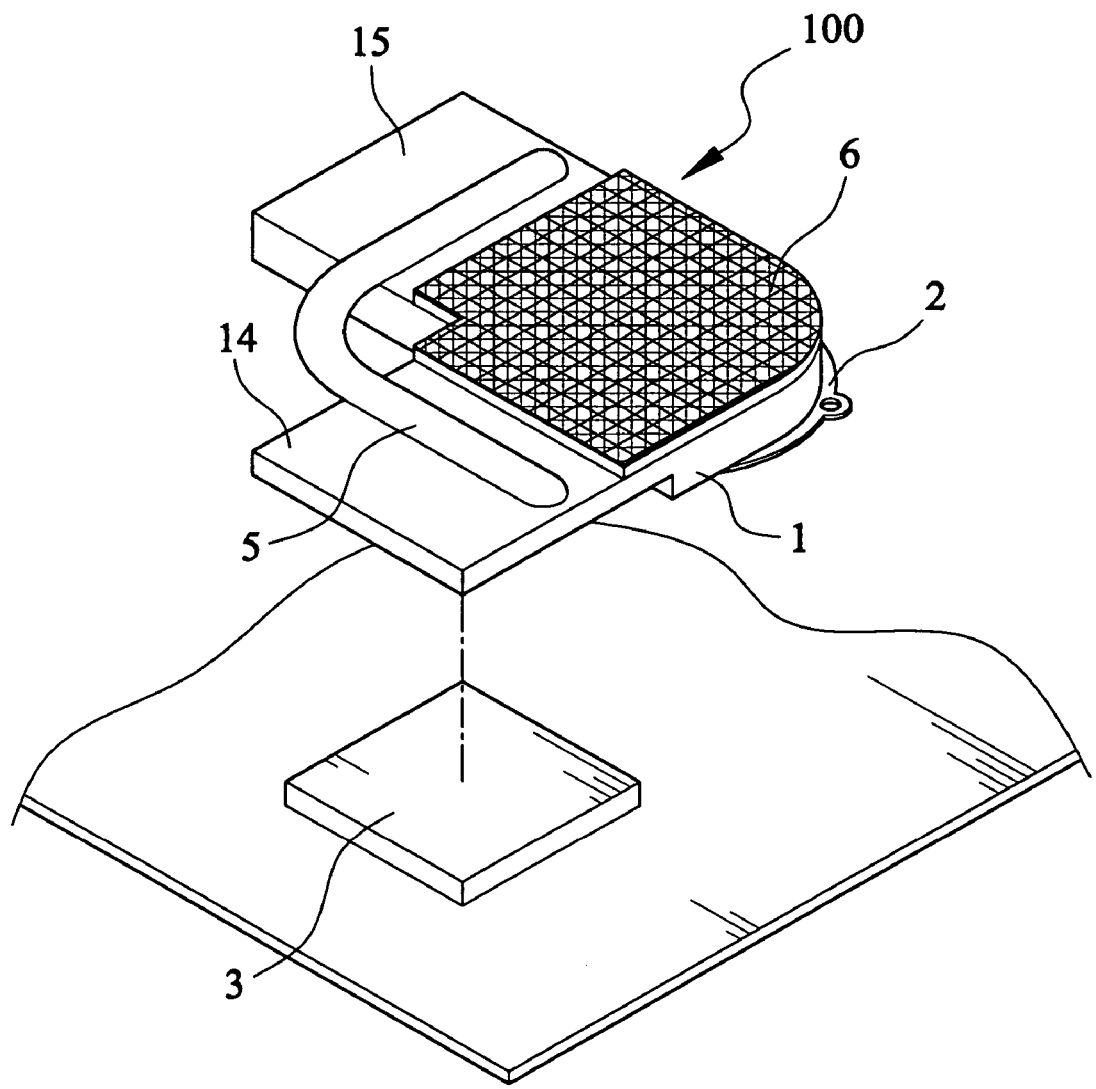
FIG. 3 is a perspective view showing spatial relationship between the heat dissipation device of the present invention and an integrated circuit chip.

Also referring to FIG. 3, a device-engaging section or board 14, also made of thermally conductive material, extends transversely from the casing 1. The device-engaging section 14 is positionable on and physically engageable with a heat source 3, such as a central processing unit (CPU) chip of a computer or other integrated circuits that generate heat. Due to the physical engagement between the heat source 3 and the device-engaging section 14, heat is transferred from the heat source 3 to the device-engaging section 14 and then to the casing 1.

Figure 4:
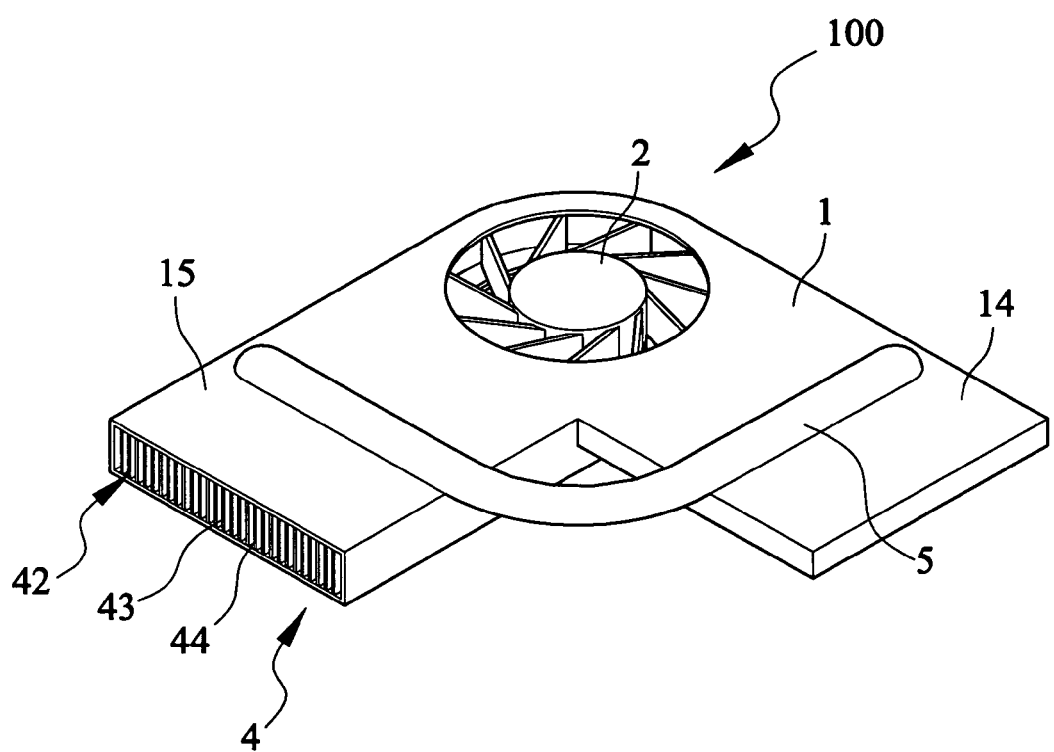
FIG. 4 is another perspective view of the heat dissipation device of the present invention with a surface cover board removed.
Figure 5:
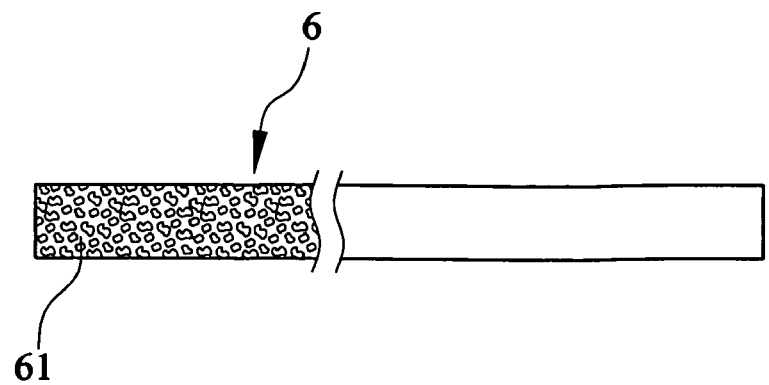
FIG. 5 is a cross-sectional view of the surface cover board in accordance with the present invention.

Also referring to FIG. 4, a heat dissipation section 15, also transversely extending from the casing 1, defines an interior space (not labeled) in fluid communication with the chamber of the casing 1. A finned heat dissipation module 4 is accommodated in the interior space of the heat dissipation section 15. The finned heat dissipation module 4 is comprised of elongate fins 43 spaced from each other to define air channels 44 therebetween. The air channels 44 extend in a direction away from the casing 1 and has opposite air inlet end 41 adjacent to the casing 1 for receiving airflow induced by the fan module 2 and air outlet end 42 away from the casing 1 through which the airflow leaves the heat dissipation device 100.

Heat transfers between the airflow and the fins 43 when the airflow passes through the channels 44 that are delimited by the fins 43. This allows heat to be removed from the heat dissipation device 100 when the airflow leaves the device 100.

A heat pipe 5 is selectively arranged between the device-engaging section 14 and the heat dissipation section 15 of the heat dissipation device 100. The heat pipe 5 enhances heat transfer from the device-engaging section 14 to the heat dissipation section 15 and thus the heat removal rate by the airflow through the channels 44 of the heat dissipation module 4 accommodated in the heat dissipation section 15.

A surface cover board 6, made of a thermally conductive material, is attached to and overlaps the upper plate 12 of the casing 1. In one embodiment, the surface cover board 6 covers the hole of the upper plate 12, namely the first air entrance 131. The surface cover board 6 is in physical engagement with the upper plate 12 of the casing 1, whereby heat transferred from the device-engaging section 14 to the casing 1 is transmitted to the surface cover board 6 also. If desired, the surface cover board 6 may extend over either the device-engaging section 14 or the heat dissipation section 15.

Figure 6:
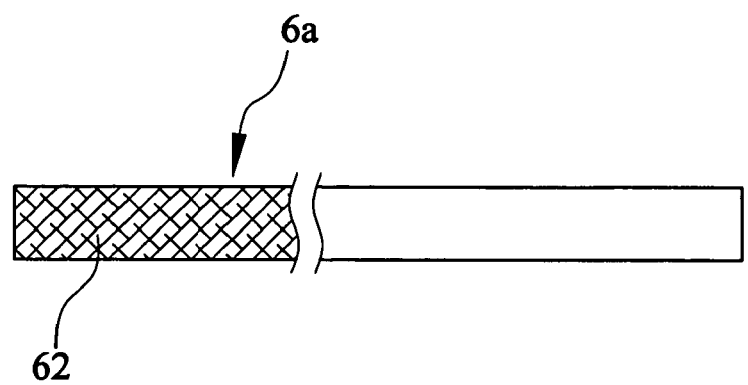
FIG. 6 is a cross-sectional view similar to FIG. 5, but showing another embodiment of the surface cover board.

Also referring to FIG. 6, the surface cover board 6 defines air passages 61 therein to allow air to flow therethrough and entering the chamber of the casing 1. An example of the surface cover board 6 is made of porous metal, such as foamed aluminum. The porous metal that makes the surface cover board 6 forms cavities or pores inside the board 6. The pores are connected to each other to form the air passages 61. Thus, air is allowed to flow through the surface cover board 6 without significant resistance.

Figure 7:
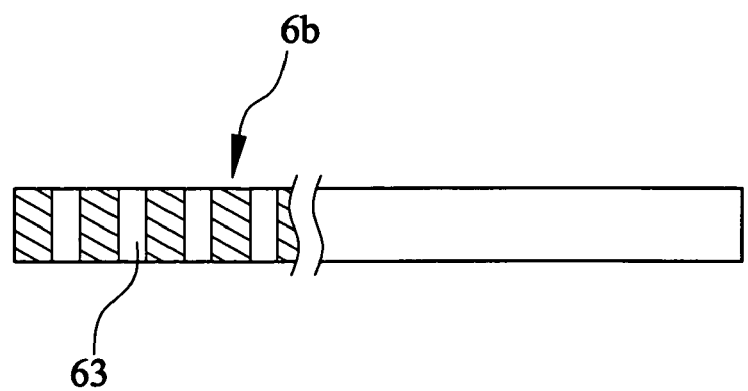
FIG. 7 is a cross-sectional view similar to FIGS. 5 and 6 but showing a further embodiment of the surface cover board.

Another example of the surface cover board, such as that designated with reference numeral 6a shown in FIG. 6, is made of interconnected metal filaments or metal threads. Air passages 62 are formed among the filaments or threads, which allow air to flow into the casing 1. If desired, layers of interconnected metal filaments or threads may be stacked over each other to form the surface cover board 6a. A further example of the surface cover board is illustrated in FIG. 7 and designated with reference numeral 6b. The surface cover board 6b comprises a metal board in which apertures 63 are defined. The apertures 63 extend through the metal board to form air passages for airflow that is drawn into the casing 1 by the fan module 2.

Figure 8:
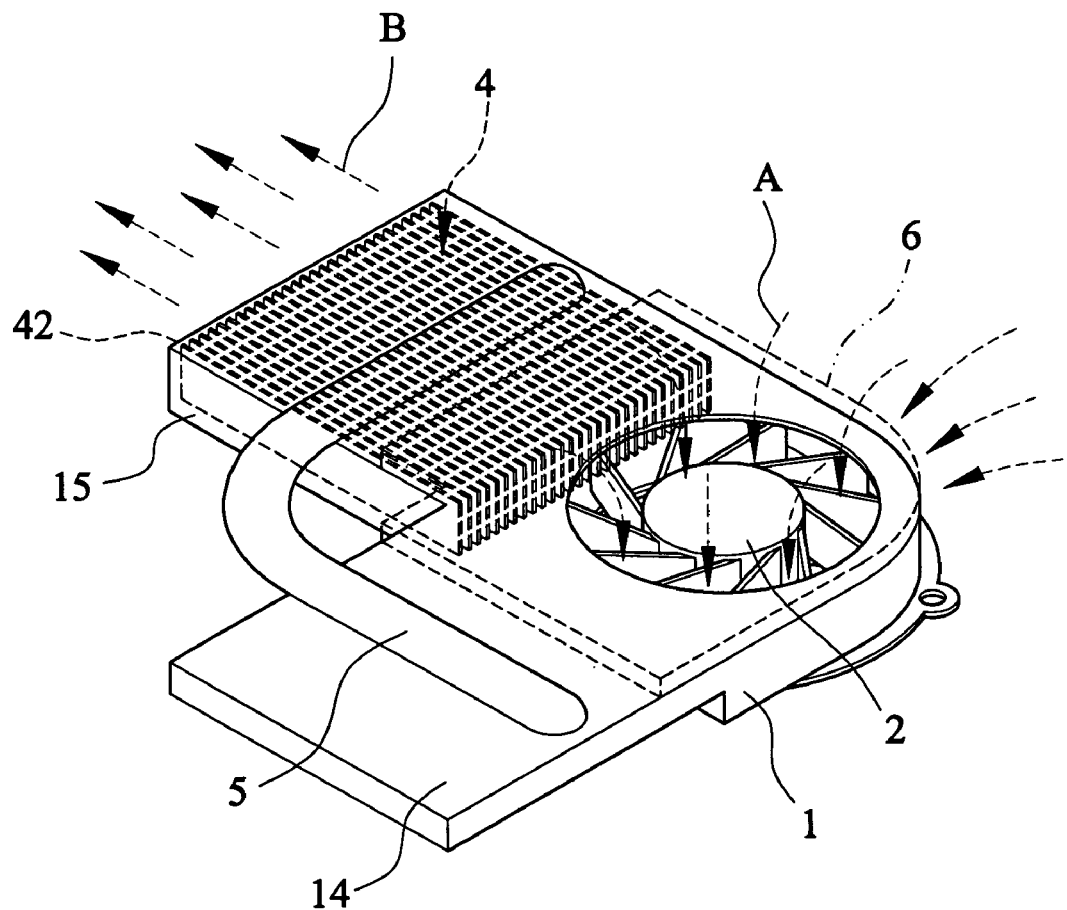
FIG. 8 is a perspective view of the heat dissipation device of the present invention, illustrating airflow that removes heat from the heat dissipation device.
Figure 9:
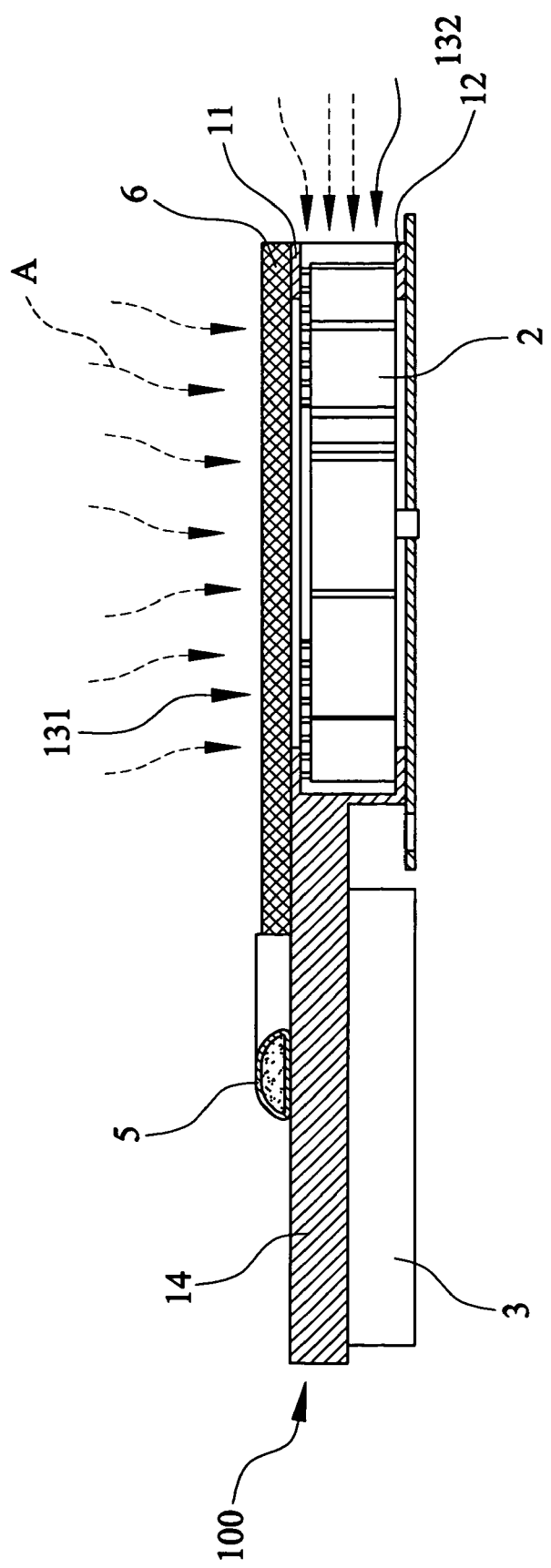
FIG. 9 is a cross-sectional view taken along line 9—9 of FIG. 2, illustrating airflow entering the heat dissipation device of the present invention.
Figure 10:
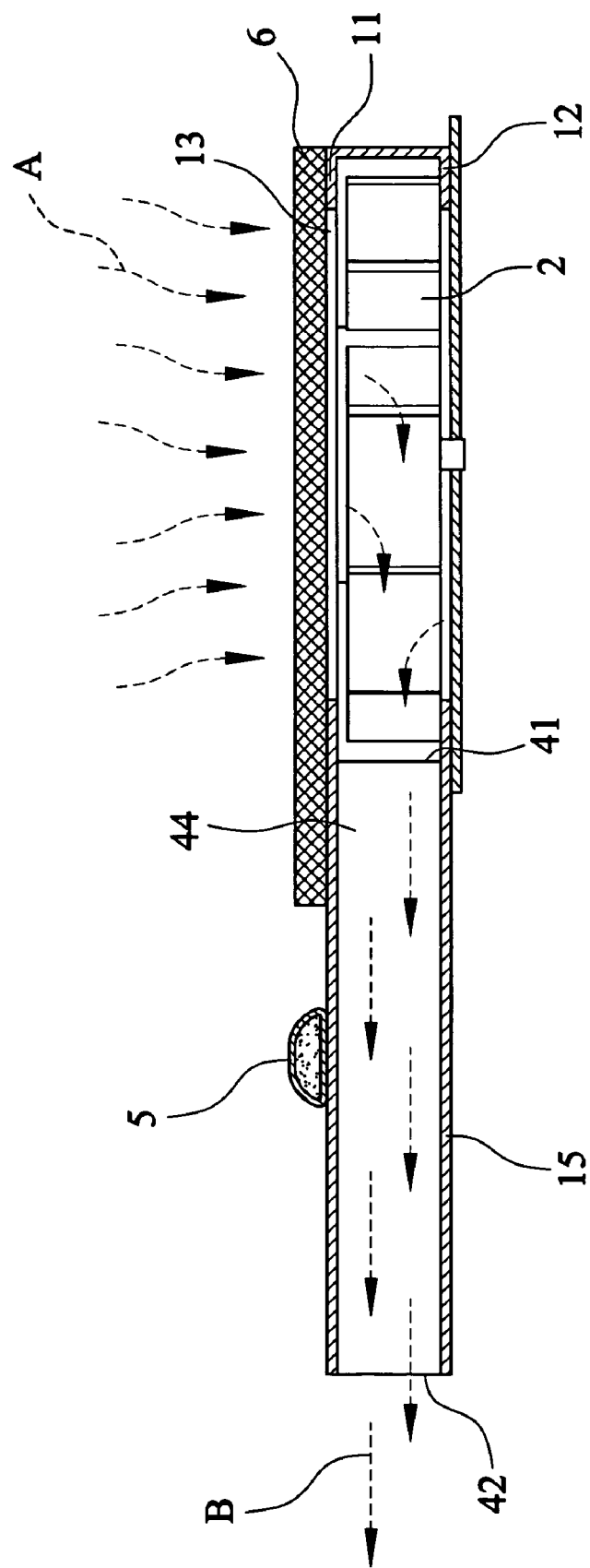
FIG. 10 is a cross-sectional view taken along line 10—10 of FIG. 2, illustrating airflow leaving the heat dissipation device of the present invention.

Also referring to FIGS. 8–10, in operation, heat generated by the heat source 3 is transferred into the device-engaging section 14 through physical engagement therebetween. The heat is further transferred to the casing 1 and the surface cover board 6 by means of conduction. The heat that is transferred to the casing 1 is further transferred to the heat dissipation section 15 by conduction. Heat is also directly transferred from the device-engaging section 14 to the heat dissipation section 15 by the heat pipe 5.

Air is drawn into the casing 1 by the fan module 2 through the air entrance 131, as indicated by arrow A. The air that enters the entrance 131 passes through the air passages 61 (or 62, 63) of the surface cover board 6 (or 6a, 6b). Additional air is drawn into the casing 1 through the second entrance 132. The air that enters the casing 1 is driven by the fan module 2 into and flowing through the channels 44 of the heat dissipation module 4, as indicated by arrow B. The leaving airflow B enters the channels 44 through the inlet end 41 and leaves the heat dissipation device 100 through the outlet end 42.

When the airflow B passes through the channels 44 that are comprised of elongate fins 43, the heat that is transmitted to the heat dissipation section 15 is transferred to the airflow B through convection and radiation between the fins 43 and the airflow B. Thus, the heat is carried away from the heat dissipation device 100 by the airflow B.

Besides the heat exchange between the airflow B and the fins 43, heat is also transferred to the airflow A by convection and radiation when the airflow A passes through air passages 61 (or 62, 63) of the surface cover board 6 (or 6a, 6b). Thus, the heat dissipation device 100 provides a mechanism for twice heat exchange with air. This feature significantly prompts heat removal from the heat dissipation device 100 by airflow.

Since the surface cover board 6 (or 6a, 6b) is constructed to allow airflow to pass therethrough, air still can be drawn into the casing 1 smoothly without additional effort by the fan module 2. If desired, a gap may be present between the surface cover board 6 and the upper plate 11 of the casing 1. However, proper physical engagement between the surface cover board 6 and the casing 11 may be maintained to ensure heat transfer between the surface cover board 6 and the casing 11.

Figure 11:
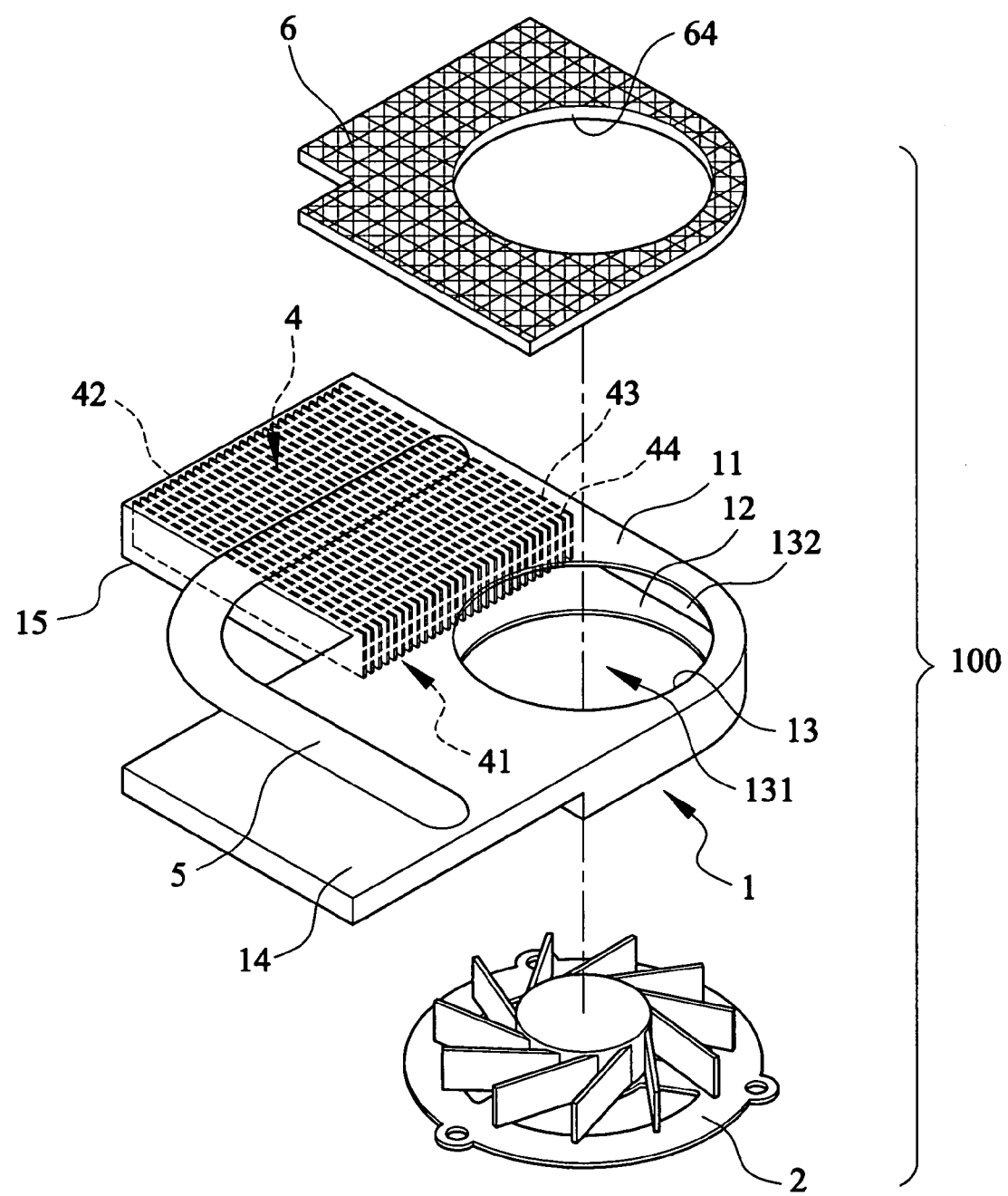
FIG. 11 is an exploded view of a heat dissipation device constructed in accordance with a different embodiment of the present invention in which the surface cover board defines a bore corresponding in position to a fan of the heat dissipation device.

Also referring to FIG. 11, the surface cover board 6 may also be constructed to define a bore 64 corresponding in position to the air entrance 131 of the upper plate 11 of the casing 1 to allow air to flow into the casing 1. The bore 64 may also have a size corresponding to or different from the air entrance 131 of the casing 1.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A heat dissipation device comprising:
   a casing forming a receptacle, the casing comprising upper and lower plates spaced from each other to define a chamber therebetween, first and second air entrances formed in said casing in fluid communication with the chamber, a first section extending from the casing and adapted to physically engage a heat source, and a second section extending from the casing and defining an interior space;
   an airflow generator received and retained in the receptacle of the casing;
   a heat dissipation module received in the interior space of the second section and comprising spaced fins that define at least one channel extending from the chamber to an air outlet, whereby an airflow induced by the airflow generator is driven through the channel for primary heat exchange with the heat dissipation device, wherein said first air entrance is formed in at least one of said upper and lower plates, and wherein said secone air entrance is defined in a side wall of said casing between said upper and lower plwtes thereof, the air flow incoming to said chamber through said second air entrance being in crossing relationship with said at least one channel of said heat dissipation module; and
   a surface cover board mounted to the casing and covering at least partially said first air entrance, the surface cover board being made of thermally conductive materials and defining air passages to allow air to flow therethrough for secondary heat exchange with the heat dissipation device.

2. The heat dissipation device as claimed in claim 1, further comprising a heat pipe extending between the first and second sections of the heat dissipation device for directly transferring heat from the first section to the second section.

3. The heat dissipation device as claimed in claim 1, wherein the surface cover board comprises a metal board defining pores therein, the pores being connected with each other to define the air passages through the surface cover board.

4. The heat dissipation device as claimed in claim 1, wherein the surface cover board comprises interconnected metal threads.

5. The heat dissipation device as claimed in claim 1, wherein the surface cover board comprises a metal board through which a plurality of apertures are defined.

6. The heat dissipation device as claimed in claim 1, wherein the surface cover board defines at least one bore.

7. The heat dissipation device as claimed in claim 1, wherein the surface cover board is provided with a bore aligned with said first air entrance and having a size corresponding to that of said air entrance of the casing.

* * * * *